(12) United States Patent
Xu et al.

(10) Patent No.: US 7,388,772 B1
(45) Date of Patent: Jun. 17, 2008

(54) LATCH CIRCUIT

(75) Inventors: Yanzhong Xu, Santa Clara, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 123 days.

(21) Appl. No.: 11/385,531

(22) Filed: Mar. 20, 2006

(51) Int. Cl.
*G11C 11/00* (2006.01)

(52) U.S. Cl. .................. 365/154; 365/156; 365/189.05

(58) Field of Classification Search ................ 365/154, 365/156, 190, 189.05
See application file for complete search history.

(56) References Cited

U.S. PATENT DOCUMENTS 4,956,814 A * 9/1990 Houston ..................... 365/154
6,111,780 A * 8/2000 Bertin ......................... 365/154
6,795,333 B2 * 9/2004 Notani ........................ 365/154

* cited by examiner

*Primary Examiner*—Son Dinh
(74) *Attorney, Agent, or Firm*—Morgan, Lewis & Bockius LLP

(57) ABSTRACT

A latch circuit comprises eight MOS transistors in which a first pair of transistors are connected in series between a voltage supply node and ground and a second pair of transistors are connected in parallel to the first pair between the voltage supply node and ground. A fifth transistor is connected between the gates of the first pair and a node between the transistors of the second pair and a sixth transistor is connected between the gates of the second pair and a node between the transistors of the first pair. The seventh transistor is a write transistor connected between a data in line and the node between the first pair of transistors and the eighth transistor is a clear transistor connected between the node between the second pair of transistors and ground.

19 Claims, 5 Drawing Sheets

LATCH CIRCUIT

FIELD OF THE INVENTION

This relates to a latch circuit and a method of operating it.

BACKGROUND OF THE INVENTION

FIG. 1 depicts a prior art latch circuit 100 comprising eight MOS transistors 110, 120, 130, 140, 150, 160, 170 and 180. Each MOS transistor has a source, a drain and a gate. Transistors 110, 130, 140, and 160 are preferably PMOS transistors; and transistors 120, 150, 170 and 180 are preferably NMOS transistors. The first and second transistors 110, 120 are connected in series such that a source and drain of the first transistor 110 are connected between a first node 115 and a second node 125 and the source and drain of the second transistor are connected between a third node 135 and the second node 125. The third transistor 130 is connected in parallel with the first transistor 110 so that its source and drain are also connected between the first node and the second node. The fourth and fifth transistors 140, 150 are connected in series such that a source and drain of the fourth transistor 140 are connected between the first node 115 and a fourth node 145 and the source and drain of the fifth transistor 150 are connected between the third node 135 and the fourth node 145. The sixth transistor 160 is connected in parallel with the fourth transistor 140 so that its source and drain are also connected between the first node and the fourth node. The first node is connected to a positive power supply and the third node is connected to ground. The voltage level at node 115 represents a logic high and the ground potential a logic low. Transistors 110, 120, 130 will be recognized as forming a first inverter having an input at the gates of transistors 110, 120 130 and an output at second node 125 and transistors 140, 150, 160 as forming a second inverter having an input at the gates of transistors 140, 150, 160 and an output at fourth node 145. In each inverter, the PMOS pull-up transistors have been doubled to enhance stability of the latch circuit. The inverters are cross-coupled by line 127 from second node 125 at the output of the first inverter to the gates of transistors 140, 150, 160 and by line 147 from fourth node 145 at the output of the second inverter to the gates of transistors 110, 120 130.

The source and drain of the transistor 170 are connected between a data in line 105 and the second node 125. Thus, transistor 170 functions as a write transistor for latch circuit 100. The source and drain of transistor 180 are connected between fourth node 145 and ground. Thus, transistor 180 function as a clear transistor for latch circuit 100. A data out line 185 is connected to node 145.

In operation, latch circuit 100 is cleared by applying a positive signal to the gate of transistor 180 to turn it on. As a result, node 145 is bought to essentially ground potential. Since node 145 is connected to the gates of transistor 110, 120, 130 by line 147, the ground potential is applied to those gates, turning on transistor 110 and 130 and turning off transistor 120. As a result, the potential at node 125 rises to approximately the potential of node 115. Since node 125 is connected to the gates of transistors 140, 150, 160 by line 127, a high potential is applied to these gates, turning off transistor 140 and 160 and turning on transistor 150. As a result, the potential at node 145 which had been brought to ground potential by transistor 180 is now held at ground potential by transistor 150.

Thus, as a result of the clear operation, a high potential is established at node 125 and a low potential at node 145. This is one of the two binary values that can be stored in latch 100. To store this value in the latch, there is no need to do anything after the latch is cleared. Alternatively, if a high potential signal is applied to latch 100 from data in line 105 by turning on transistor 170, the high potential will be applied to node 125 and this high potential will also be applied to the gates of transistors 140, 150, 160 thereby turning on transistor 150 so that the potential at node 145 is approximately ground potential.

On the other hand, if a low potential signal is written to latch 100 after it has been cleared, the low potential signal will be applied to node 125 and this low potential will reduce the voltage at the gates of transistors 140, 150 160, thereby turning on transistors 140, 160 and turning off transistor 150. As a result, the potential at node 145 rises to approximately the potential of power supply node 115. This causes the potential at the gates of transistor 110, 120, 130 to rise, thereby turning off transistors 110, 130 and turning on transistor 120. As a result, the potential at node 125, which had been brought to a low potential by transistor 170 is now held at ground potential by transistor 120. Thus, as a result of the write low operation, a low potential is at node 125 and a high potential at node 145. This is the second of the binary values that can be stored in latch 100.

The circuit of FIG. 1 has the disadvantage that it has a relatively high soft error rate (SER). As a result, this circuit is not an attractive candidate for use in critical memory functions such as memory cells in configuration random access memory (CRAM) where a single erroneous bit in the CRAM may render unusable the programmable logic array (PLA) that is programmed by the CRAM.

In an effort to reduce SER, resistors have been inserted in the feedback paths between the inverters. The resistors dampen disturbances between the nodes and reduce the likelihood that such disturbances would flip the logic state of the circuit. FIG. 2 depicts a circuit 200 that has the same transistors and the same topology as circuit 100. Accordingly, the transistors and nodes of FIG. 2 bear the same numbers as those of FIG. 1 increased by 100. Circuit 200 differs from circuit 100 in that node 225 is connected to the gates of transistors 240, 250, 260 by a feedback resistor 228 instead of lead 127 and node 245 is connected to the gates of transistors 210, 220, 230 by a feedback resistor 248 instead of lead 147. However, it is not practical in conventional CMOS technology to achieve significant resistance values in a small layout area. As a result, feedback resistors are not used in latch circuits for technology nodes less than 0.25 um. Accordingly, there is a continuing need for latch circuits with better SER.

SUMMARY OF THE INVENTION

A preferred embodiment of the latch circuit of the present invention comprises eight MOS transistors in which a first pair of transistors are connected in series between a voltage supply node and ground and a second pair of transistors are connected in parallel to the first pair between the voltage supply node and ground. A fifth transistor is connected as a pass gate between the gates of the first pair and a node between the transistors of the second pair and a sixth transistor is connected as a pass gate between the gates of the second pair and a node between the transistors of the first pair. The seventh transistor is a write transistor connected between a data in line and the node between the first pair of transistors and the eighth transistor is a clear transistor connected between the node between the second pair of transistors and ground.

The pass gate can be controlled to isolate disturbing currents and thereby prevent them from flipping the logic state of the latch circuit. For example, the control signal applied to the pass gates can be −1 Volt or lower when programming the logic circuit and can be raised to about zero Volts to improve SER. Advantageously, the eight transistor latch circuit of the present invention can be implemented using the same amount of space and same layout in an integrated circuit as that of the eight transistor latch circuit of FIG. 1 with only a different set of interconnections.

BRIEF DESCRIPTION OF THE DRAWINGS

These and other objects, features and advantages of the present invention will be more readily apparent from the following Detailed Description in which.

DETAILED DESCRIPTION

Figure 3:
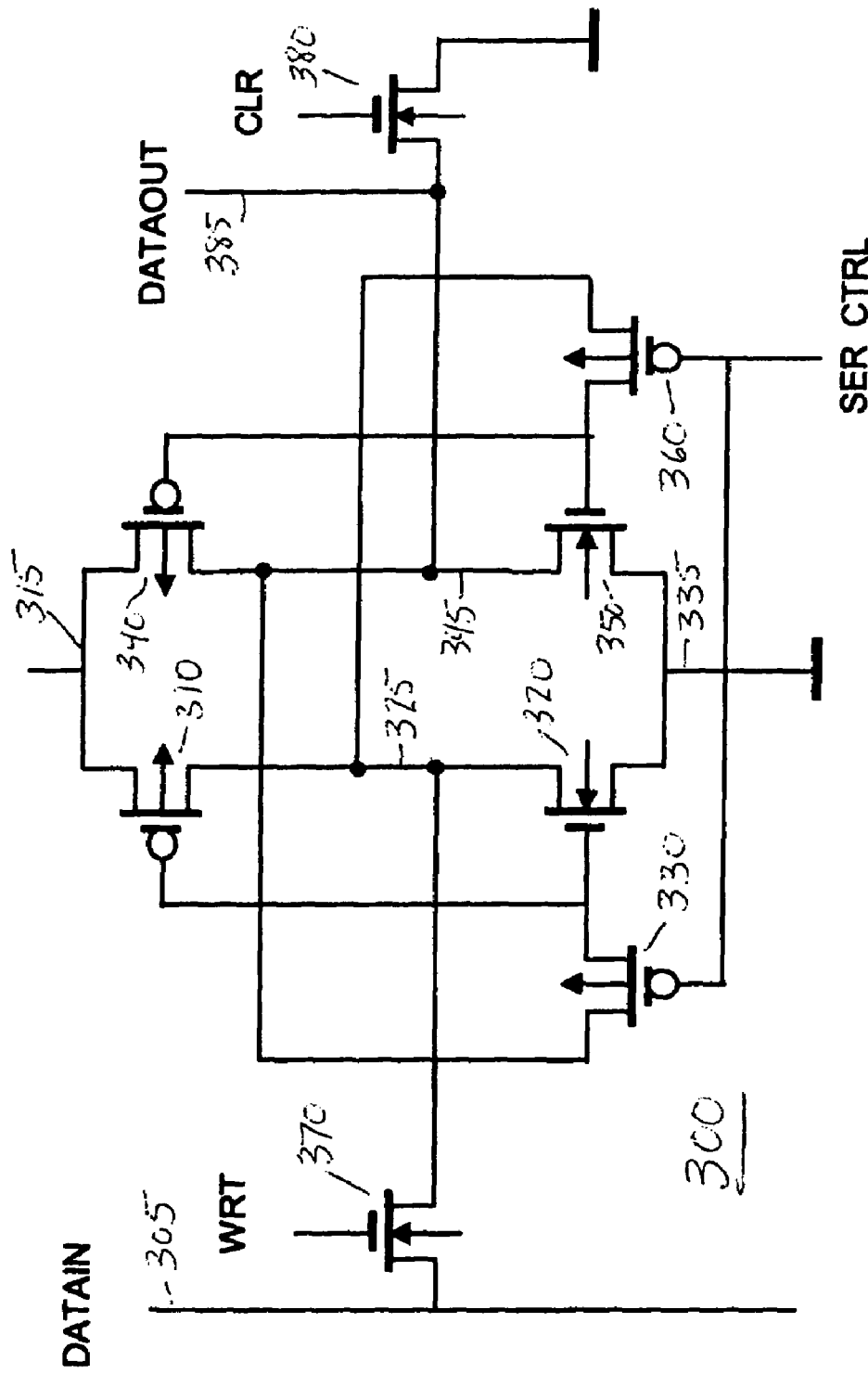
FIG. 3 is a circuit diagram of an illustrative embodiment of the present invention.

FIG. 3 depicts an illustrative embodiment of a latch circuit 300 of the present invention comprising eight MOS transistors 310, 320, 330, 340, 350, 360, 370 and 380. Each MOS transistor has a source, a drain and a gate. Transistors 310, 330, 340 and 360 are preferably PMOS transistors; and transistors 320, 350, 370 and 380 are preferably NMOS transistors. The first and second transistors 310, 320 are connected in series such that a source and drain of the first transistor 310 are connected between a first node 315 and a second node 325 and the source and drain of the second transistor are connected between a third node 335 and the second node 325. The fourth and fifth transistors 340, 350 are connected in series such that a source and drain of the fourth transistor 340 are connected between the first node 315 and a fourth node 345 and the source and drain of the fifth transistor 350 are connected between the third node 335 and the fourth node 345. The first node is connected to a positive power supply and the third node is connected to ground. The voltage level at node 315 represents a logic high and the ground potential a logic low. Transistors 310, 320 will be recognized as forming a first inverter having an input at the gates of transistors 310, 320 and an output at second node 325 and transistors 340, 350 as forming a second inverter having an input at the gates of transistors 340, 350 and an output at fourth node 345.

The first and second inverters are cross-coupled by transistors 330, 360. In particular, third transistor 330 is connected so that its source and drain are connected between the fourth node 345 and the gates of transistors 310 and 320. Sixth transistor 360 is connected so that its source and drain are connected between the second node 325 and the gates of transistors 340 and 350. The gates of transistors 330 and 360 are connected together and controlled by a control signed SER_CTRL. Transistors 330, 360 function as pass gates and the control signal SER_CTRL is used to limit the time period that the voltages on nodes 325 and 345 are applied to the gates of transistors 310, 320, 340, 350. As a result, when transistors 330, 360 are off, transients that arise when the latch is changing state can be suppressed and logic circuit can be protected from random events that occur at an output node and otherwise would be fed back to an input. It should be noted that the use of PMOS transistors for transistors 330, 360 is especially advantageous since PMOS transistors have lower soft error rates due to alpha particle bombardment than NMOS transistors.

The source and drain of the transistor 370 are connected between a data in line 305 and the second node 325. Thus, transistor 370 functions as a write transistor for latch circuit 300. The source and drain of transistor 380 are connected between fourth node 345 and ground. Thus, transistor 380 function as a clear transistor for latch circuit 300. A data out line 385 is connected to node 345.

In operation, latch circuit 300 is cleared by applying a positive signal to the gate of transistor 380 to turn it on. As a result, node 345 is bought to essentially ground potential. When node 345 is changing state, the control signal SER_CTRL is high turning off transistors 330 and 360. After node 345 has settled to a steady state, the control signal SER_CTRL is lowered, thereby turning on transistors 330, 360. Since node 345 is connected to the gates of transistor 310, 320 by transistor 330, the ground potential is applied to those gates, turning on transistor 310 and turning off transistor 320. As a result, the potential at node 325 rises to approximately the potential of node 315. Since node 325 is connected to the gates of transistors 340, 350, by transistor 360, a high potential is applied to these gates, turning off transistor 340 and turning on transistor 350. As a result, the potential at node 345 which had been brought to ground potential by transistor 380 is now held at ground potential by transistor 350.

Thus, as a result of the clear operation, a high potential is established at node 325 and a low potential at node 345. This is one of the two binary values that can be stored in latch 300. To store this value in the latch, there is no need to do anything after the latch is cleared. Alternatively, if a high potential signal is applied to latch 300 from data in line 305 by turning on transistor 370, the high potential will be applied to node 325 and this high potential will also be applied to the gates of transistors 340, 350, thereby turning on transistor 350 so that the potential at node 345 is approximately ground potential.

On the other hand, if a low potential signal is written to latch 300 after it has been cleared, the low potential signal will be applied to node 325 and this low potential will reduce the voltage at the gates of transistors 340, 350 thereby turning on transistor 340, and turning off transistor 350. As a result, the potential at node 345 rises to approximately the potential of power supply node 315. This causes the potential at the gates of transistor 310, 320 to rise, thereby turning off transistor 310 and turning on transistor 320. As a result, the potential at node 325, which had been brought to a low potential by transistor 370 is now held at ground potential by transistor 320. Thus, as a result of the write low operation, a low potential is at node 325 and a high potential at node 345. This is the second of the binary values that can be stored in latch 300.

Figure 4:
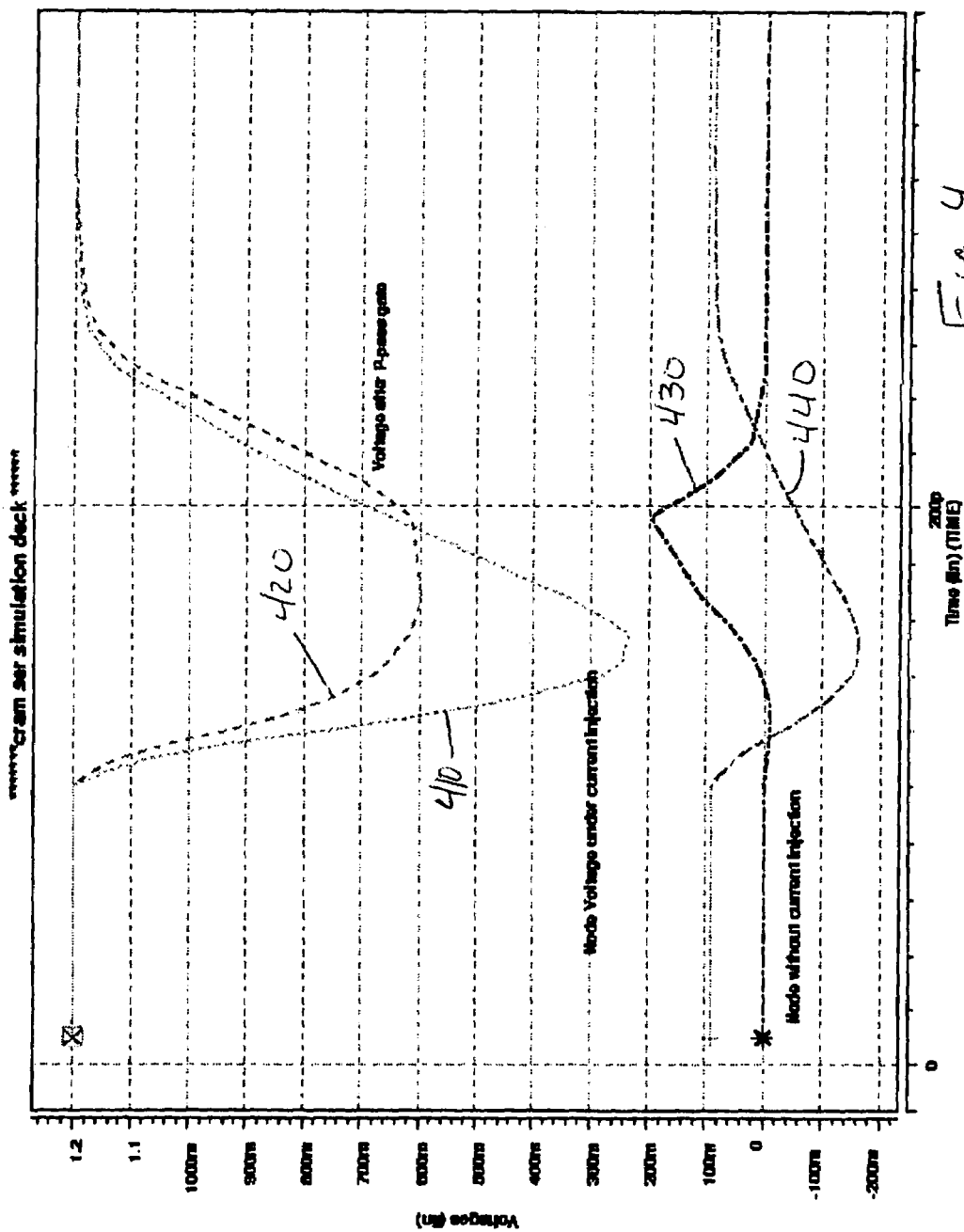
FIG. 4 is a plot of voltage potentials at certain nodes of the circuit diagram of FIG. 3.
Figure 5:
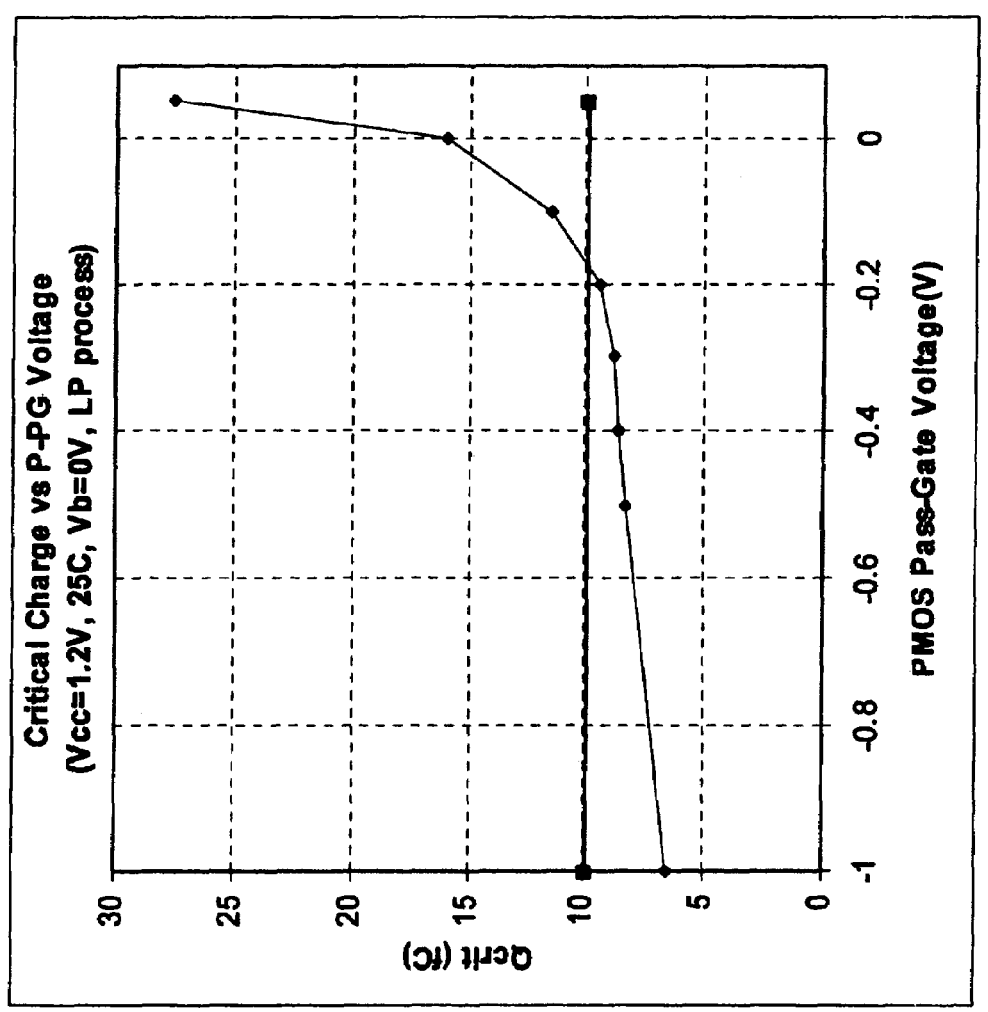
FIG. 5 is a plot of the soft error rate of the circuit of FIG. 3 versus a prior art circuit.

Some of the advantages of the circuit of FIG. 3 will be apparent from the plots of FIGS. 4 and 5. FIG. 4 is a simulation of the high and low voltage potentials at the inputs of the inverters and the impact on these potentials when a random event occurs that affects the output voltage potential at the other inverter. An illustrative random event might be a collision between an alpha particle and the substrate near the inverter output. In FIG. 4, the onset of the random event occurs at about 100 picoseconds from the start time. Vcc is assumed to 1.2 volts and the potential at the gates of the pass transistors is assumed to be 0 volts. The process is a 65 nanometer process.

Figure 1:
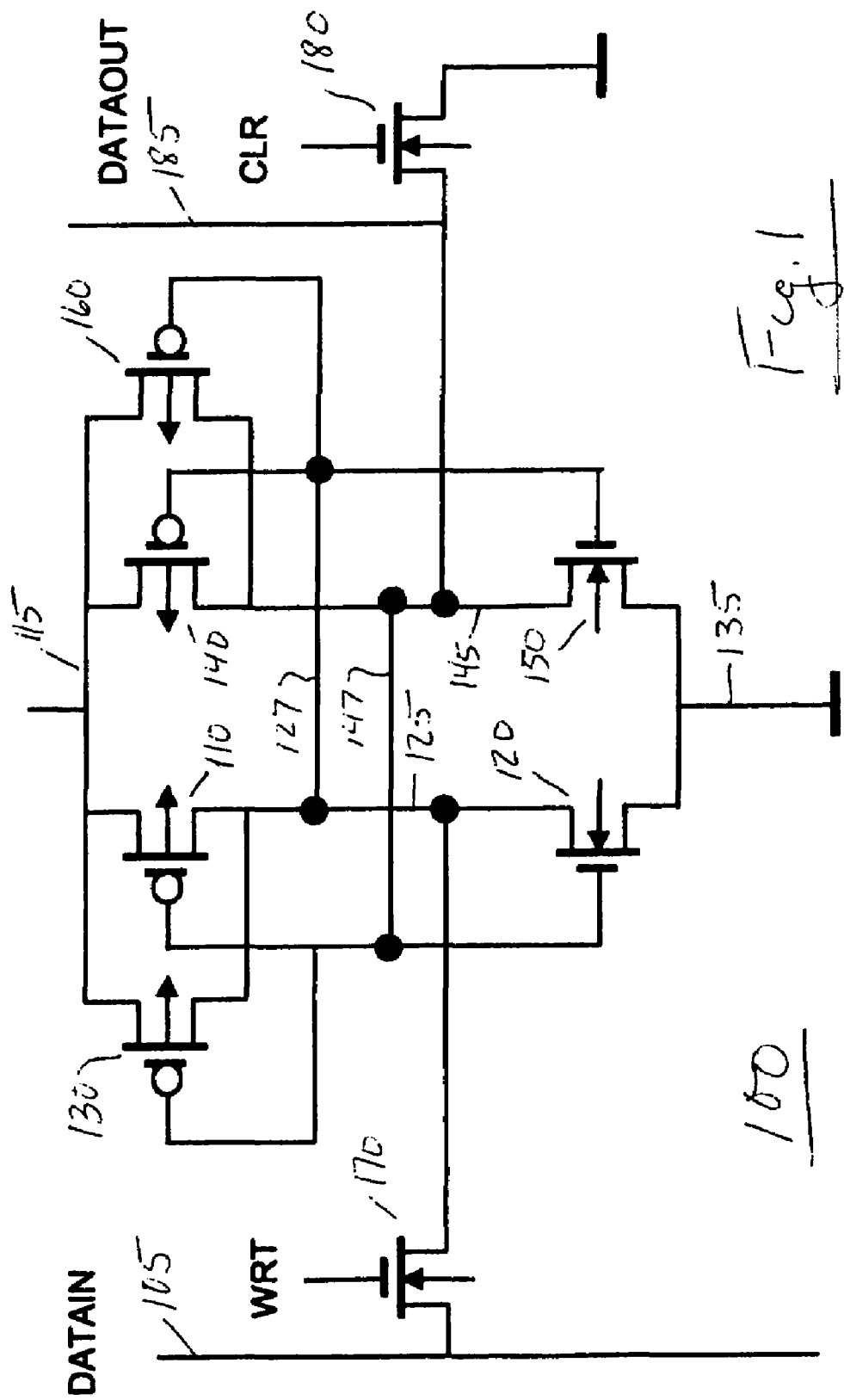
FIGS. 1 and 2 are circuit diagrams of prior art latch circuits.
Figure 2:
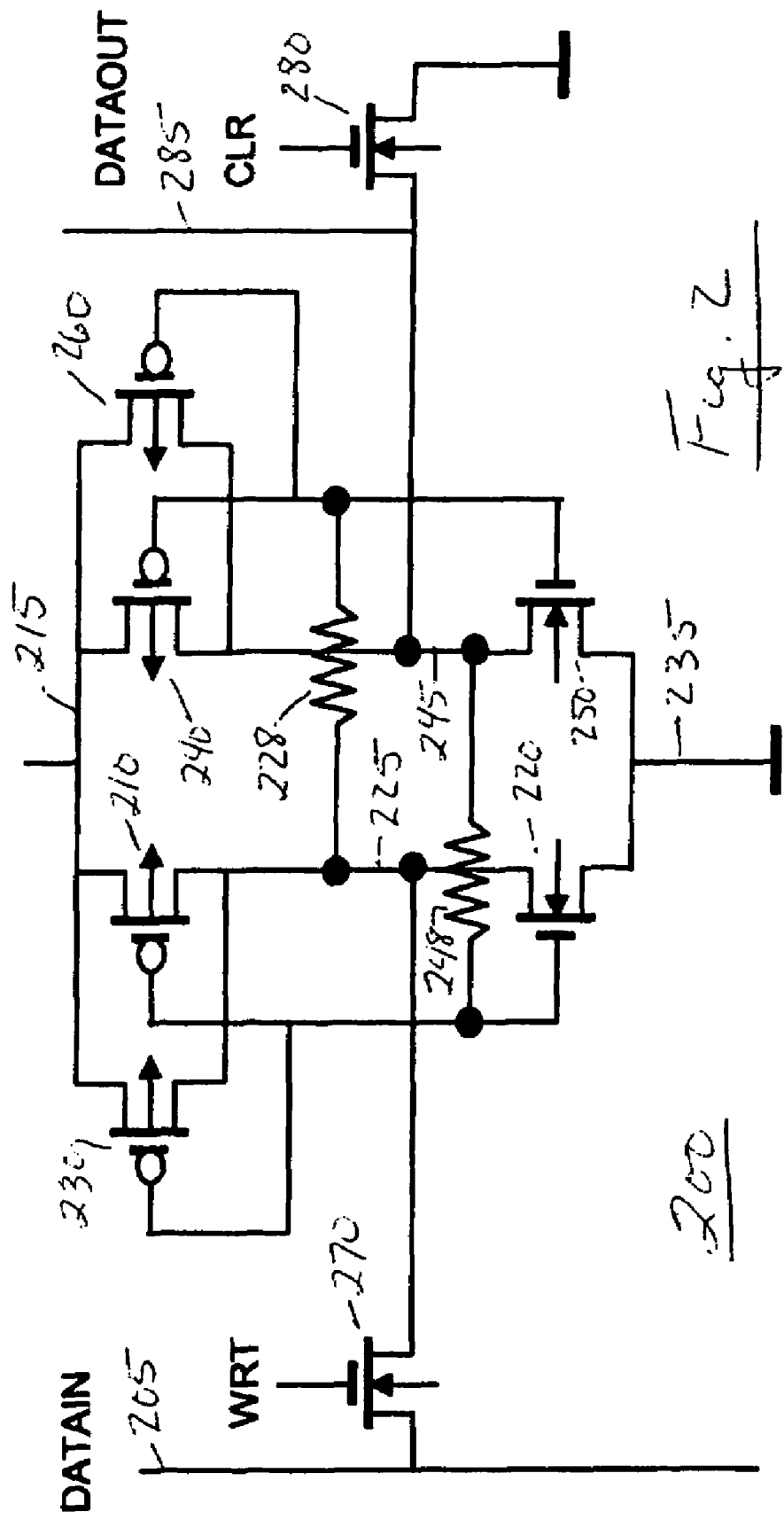

Waveform 410 depicts the voltage waveform that might be seen in such an event at the gates at the input of the inverters in the case where pass gate transistors 330, 360 are not used in the circuit. For example, waveform 410 might be observed at node 147 of the circuit of FIG. 1 or at the gates of transistors 210, 220, 230. As will be apparent, the voltage dips from 1.2 volts to a low of about 250 millivolts before rising back to 1.2 volts.

Waveform 420 is a simulation of the voltage waveform that might be seen at the gates of the inverters in the case where pass gate transistors 330, 360 are used in the circuit and the potential at the gates of the transistors 330, 360 is 0 Volts. For example, waveform 420 might be observed at the gates of transistors 310, 320. As will be apparent, the voltage dips from 1.2 volts to a low of about 600 millivolts before rising back to 1.2 volts. Thus, the use of pass gates has reduced the effect of the disturbance by 350 millivolts. This difference in voltage might well be the difference between a disturbance that cause an unwanted change in the logic state of the circuit and one that does not.

Waveform 430 depicts the voltage waveform that might be seen at the gates of the other inverter in the case where pass gates are not used in the circuit. As will be apparent, the voltage rises from 0 volts to about 200 millivolts before settling back to 0 volts. Waveform 440 depicts the voltage waveform that might be seen at the gates of the other inverter where pass gates are used. Here, the voltage decreases from about 100 millivolts to about −150 millivolts before rising back to 100 millivolts.

The advantages of the present invention are also seen in the plot of FIG. 5 of critical charge versus pass gate voltage. Critical charge is the amount of charge at which the logic state of a logic circuit would flip, thereby causing a soft error. A typical value of the critical charge in a configuration random access memory (CRAM) is 10 femtoCoulombs. FIG. 5 plots the value of the critical charge for the circuit of FIG. 3 at different levels of voltage applied to pass gate transistors 330, 360. Thus, at decreasing voltage levels below about −0.2 volts, the critical charge ranges downward from slightly under 10 femtoCoulombs to about 7 femtoCoulombs at −1 volts. Above about −0.2 volts, the critical charge increases rapidly, reaching about 16 femtoCoulombs at 0 volts and 20 femtoCoulombs at about 0.02 volts.

Thus, by using a pass gate transistor voltage of slightly more than 0 volts, the critical charge required to cause a soft error in the circuit of FIG. 3 can be increased by a factor of 2. This results in a soft error rate that is the equivalent of what is achieved by dynamic random access memory (DRAM) and is a considerable improvement over the soft error rate of conventional CRAM.

As will be apparent to those skilled in the art, numerous variations may be made within the spirit and scope of the invention.

What is claimed is:

1. A latch circuit comprising first, second, third, fourth, fifth and sixth MOS transistors, each having a source, a drain and a gate,
   the first and second transistors being connected in series such that a source and drain of the first transistor are connected between a first node and a second node and the source and drain of the second transistor are connected between a third node and the second node, the first transistor having a first conductivity type and the second transistor having a second conductivity type;
   the third and fourth transistors being connected in series such that a source and drain of the third transistor are connected between the first node and a fourth node and the source and drain of the fourth transistor are connected between the third node and the fourth node, the third transistor having the first conductivity type and the fourth transistor having the second conductivity type;
   the source and drain of the fifth transistor being connected between the fourth node and the gates of the first and second transistor; and
   the source and drain of the sixth transistor being connected between the third node and the gates of the third and fourth transistors.

2. The latch circuit of claim 1 further comprising a seventh MOS transistor having a source and drain connected between a data in line and the second node.

3. The latch circuit of claim 1 further comprising an eighth MOS transistor having a source and drain connected between the fourth node and ground.

4. The latch circuit of claim 1 further comprising a data out line connected to the fourth node.

5. The latch circuit of claim 1 wherein the first conductivity type is P type and the second conductivity type is N type.

6. The latch circuit of claim 1 wherein the first conductivity type is N type and the second conductivity type is P type.

7. The latch circuit of claim 1 wherein the fifth and sixth transistors have the same conductivity type as the first transistor.

8. The latch circuit of claim 1 wherein the first node is connected to a non-zero voltage supply and the third node is connected to ground.

9. A latch circuit comprising:
   a first pair of transistors comprising a PMOS transistor and an NMOS transistor connected in series between a power supply node and ground;
   a second pair of transistors comprising a PMOS transistor and an NMOS transistor connected in parallel with the first pair of transistors between the power supply node and ground;
   a fifth transistor connected between gates of the first pair of transistors and a first node between the second pair of transistors; and
   a sixth transistor connected between gates of the second pair of transistors and a second node between the first pair of transistors.

10. The latch circuit of claim 9 further comprising a write transistor connected between a data in line and the second node.

11. The latch circuit of claim 9 further comprising a clear transistor connected between the first node and ground.

12. The latch circuit of claim 9 further comprising a data out line connected to the fourth node.

13. The latch circuit of claim 9 wherein the PMOS transistor of the first pair of transistors is connected between the power supply node and the second node and the PMOS transistor of the second pair of transistors is connected between the power supply node and the first node.

14. The latch circuit of claim 9 wherein the fifth and sixth transistors are PMOS transistors.

15. A latch circuit comprising:
   first and second inverter circuits connected between a voltage supply node and ground, each inverter circuit having an input and an output;

a first pass transistor connected between the output of the first inverter circuit and the input of the second inverter circuit;
a second pass transistor connected between the output of the second inverter circuit and the input of the first inverter circuit;
a write transistor connected between the output of the first inverter circuit and a data in line; and
a clear transistor connected between the output of the second inverter circuit and ground.

16. The latch circuit of claim 15 further comprising a data out line connected to the output of the second inverter circuit.

17. The latch circuit of claim 15 wherein each of the first and second inverter circuits comprises a PMOS transistor and an NMOS transistor connected in series, each transistor having a source, a drain and a gate, with the input of the inverter being connected to the gates of the transistor and the output to a node between the transistors.

18. The latch circuit of claim 15 wherein the first and second pass transistors are MOS transistors.

19. The latch circuit of claim 15 wherein the first and second pass transistors are PMOS transistors.

* * * * *